United States Patent [19]

Dahlberg

[11] 4,393,576

[45] Jul. 19, 1983

[54] METHOD OF PRODUCING ELECTRICAL CONTACTS ON A SILICON SOLAR CELL

[75] Inventor: Reinhard Dahlberg, Flein, Fed. Rep. of Germany

[73] Assignee: Licenta Patent-Verwaltungs-GmbH, Frankfurt am Main, Fed. Rep. of Germany

[21] Appl. No.: 298,927

[22] Filed: Sep. 2, 1981

[30] Foreign Application Priority Data

Sep. 26, 1980 [DE] Fed. Rep. of Germany ....... 3036260

[51] Int. Cl.³ ............................................ H01L 31/18
[52] U.S. Cl. ...................................... 29/572; 29/589; 29/590; 29/591; 136/244; 136/256; 156/233
[58] Field of Search ................. 29/572, 589, 590, 591, 29/423, 882; 136/244, 256; 357/71; 148/1.5; 219/121 L, 121 LC, 121 LD, 121 LE, 121 LF; 228/170; 156/233, 234, 249

[56] References Cited

U.S. PATENT DOCUMENTS 3,984,598 10/1976 Sarazin et al. ................. 156/233 X
4,296,270 10/1981 Köhler ................................ 136/244

FOREIGN PATENT DOCUMENTS 1540991 2/1979 Fed. Rep. of Germany .
2916128 10/1979 Fed. Rep. of Germany .
2951733 10/1980 Fed. Rep. of Germany .
2919041 11/1980 Fed. Rep. of Germany .

OTHER PUBLICATIONS

Kuhn et al., "Experimental Study of Laser Formed Connections for LSI Wafer Personalization", IEEE Journ. of Sol. State Cir., vol. SC-10, No. 4, Aug. 1975.
IBM Technical Disclosure Bulletin, vol. 21, No. 3, 8/78.
Harper et al., "Properties of Si Diodes Prepared by Alloying Al into n-Type Si with Heat Pulses from A Nd:Yag Laser", Sol. Sta. Ele, vol 13, pp. 1103-1109.
Pounds et al., "Formation of Ohmic Contacts to III-V Semiconductors, Using a Laser Beam", Sol. State Elec., 1974, vol. 17, pp. 245-249.

*Primary Examiner*—L. Dewayne Rutledge
*Assistant Examiner*—Alan E. Schiavelli
*Attorney, Agent, or Firm*—Spencer & Kaye

[57] ABSTRACT

A method of producing electrical contacts on a Silicon Solar Cell comprises stamping contact shapes from a carrier with a metallic film or foil adhered thereto and applying the stamped out film or foil to the silicon surface to adhere thereto while removing the carrier therefrom.

7 Claims, 7 Drawing Figures

METHOD OF PRODUCING ELECTRICAL CONTACTS ON A SILICON SOLAR CELL

BACKGROUND OF THE INVENTION

This invention relates to a method of producing electrical contacts on a silicon solar cell.

Today contacts are produced on a silicon solar cell usually using layers of metals reheated and vapour deposited under high vacuum. Since the high vacuum deposition process is relatively expensive, it has also been suggested that contacts on solar cells should be provided by spraying on metals with the aid of a plasma-jet technique. The electrical contacts are even applied with the aid of a so-called screen printing method. The common feature of all of these methods is that a part of the material which is to be used for the contacts is lost and the methods are relatively expensive.

SUMMARY OF THE INVENTION

It is an object of the present invention to provide a method of producing electrical contacts on solar cells in which the contact material not required for the contacts can be recovered completely. In addition it is cheaper than all the above mentioned known methods.

According to the invention, there is provided a method of producing electrical contacts on a silicon solar cell comprising stamping contact shapes from a carrier carrying a metal film or foil adhered to one side thereof and applying the stamped out metal film or foil to the surface of said silicon to adhere said film or foil to said surface of said silicon while removing said carrier from said film or foil.

Further according to the invention, there is provided a method of producing electrical contacts on a silicon solar cell, wherein a metal film or foil adhering to one side of a carrier is stamped out together with the carrier in the shape of the contacts; and the stamped contact film or foil is applied to the silicon so as to be detached from the carrier and to adhere to the silicon surface.

BRIEF DESCRIPTION OF THE DRAWINGS

The invention will now be described in greater detail, by way of example, with reference to the drawings, in which:

FIG. 3b shows the removal of the carrier from the foil shown in FIG. 3a, and

DESCRIPTION OF THE PREFERRED EMBODIMENTS

Basically the invention proposes a method of producing electrical contacts on a silicon solar cell, in which a metal film or foil adhering to one side of a carrier is stamped together with the carrier into the shape of the contacts and the stamped contact film or foil is applied to the silicon so that it detaches itself from the carrier and adheres to the silicon surface.

The contact film or foil adhering to the surface of the silicon may then be sintered or alloyed in a suitable atmosphere. Films or foils comprising aluminium, aluminium/silicon alloys, iron/silicon alloys, tin, lead, copper, antimony, arsenic, zinc or alloys of these metals with each other are suitable as contact materials for the silicon solar cells. The stamped out contact film or foil applied to the silicon surface is sintered or alloyed in, preferably in a reducing atmosphere for example, in a continuous furnace. The contact film or foil may also be sintered or alloyed in by means of brief heating with the aid of a focussed light beam or laser. In practice, it is also profitable to press the contact film or foil adhering to the silicon surface against the silicon surface mechanically during the alloying process.

Figure 1A:
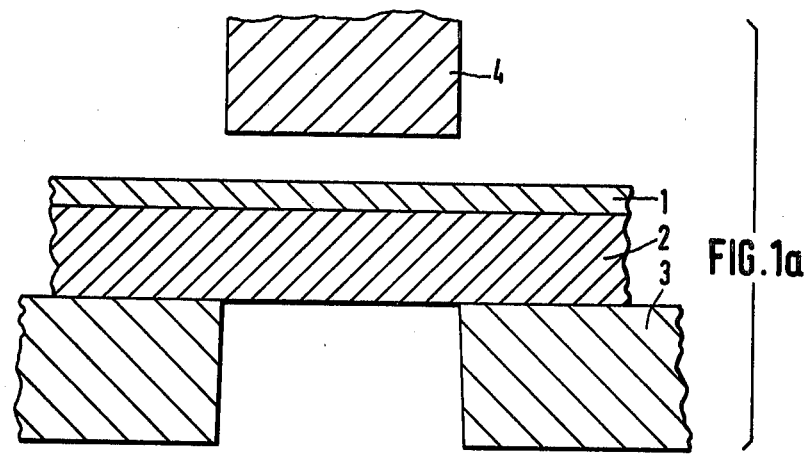
FIG. 1a is a schematic side view of a film or foil as a carrier being stamped out in accordance with the invention.
Figure 1B:
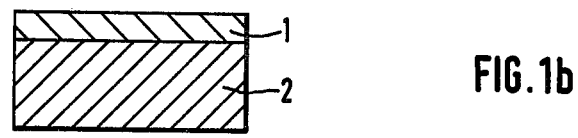
FIG. 1b is a schematic side view of a stamped out carrier with its film or foil.

Reference is now had to the drawings which show specific embodiments of the invention. In FIG. 1a a film or foil 1 comprising an aluminium/silicon alloy is stamped out with the aid of a die 3 and a stamp 4. FIG. 1b shows the stamped element comprising the carrier 2 and the film or foil 1.

Figure 2A:
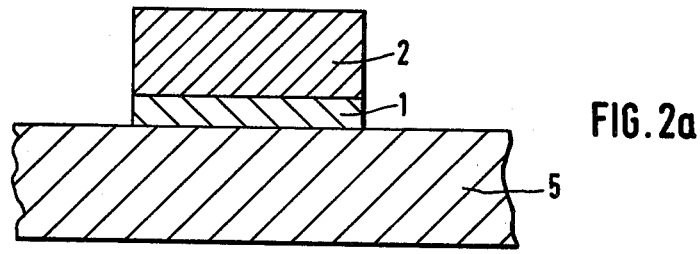
FIG. 2a shows the carrier with its film or foil being applied to the surface of a silicon solar cell.
Figure 2B:
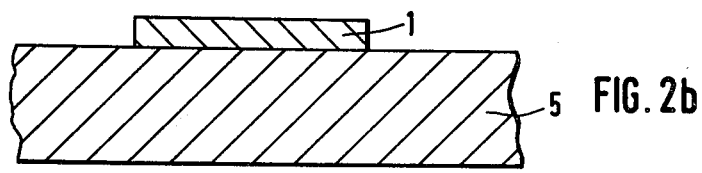
FIG. 2b shows the film or foil adhered to the silicon with the carrier removed.

In FIG. 2a the stamped element comprising the carrier 2 and metal film or foil 1 is placed onto a silicon solar cell with its metal face in contact therewith. In FIG. 2b the carrier 2 is released from the metal film or foil and the metal film or foil 1 adheres to the surface of the solar cell 5.

Figure 3A:
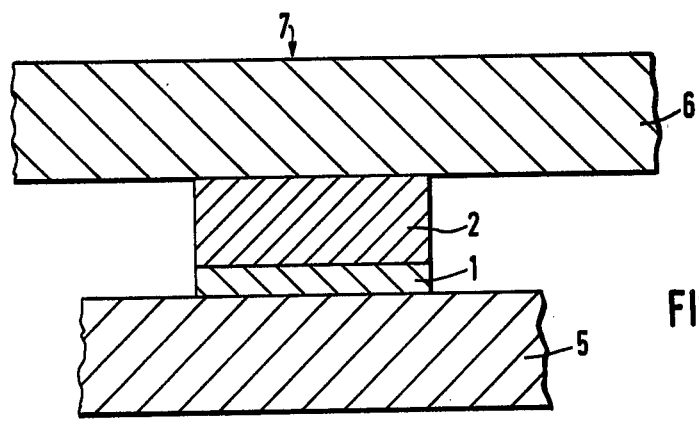
FIG. 3a shows an alternative application of the carrier and foil to the silicon surface.

In an alternative to the method steps shown in FIG. 2, in FIG. 3a the stamped element 2 with the metal film or foil 1 is placed onto the surface of a silicon solar cell 5.

The carrier 2, which can be made of an organic plastic, adheres to the conveyor belt 6 and mechanical pressure 7 is applied between the solar cell 5 and the conveyor belt 6.

Figure 3B:
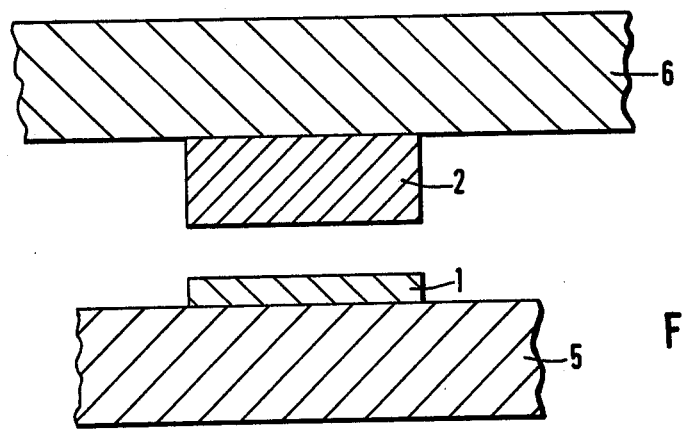

In FIG. 3b the conveyor belt 6 is separated from the solar cell 5, the carrier 2 adhering to the conveyor belt 6 while the metal film or foil 1 adheres to the surface of the solar cell 5.

Figure 3C:
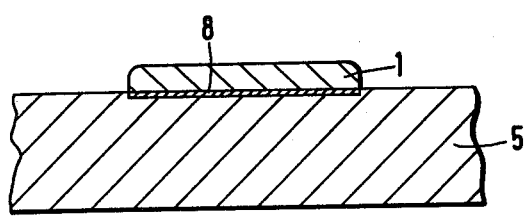
FIG. 3c shows the completed adhered contact.

In FIG. 3c, the solar cell 5 together with the metal film or foil 1 has been heated beyond the alloying temperature so that an alloy region 8 has been formed.

It will be understood that the above description of the present invention is susceptible to various modifications changes and adaptations.

What is claimed is:

1. A method of producing electrical contacts on a silicon solar cell, comprising: stamping out a metal film or foil adhering to one side of a carrier together with the carrier in the shape of the contacts; and applying the stamped contact film or foil to the silicon so as to be detached from the carrier and to adhere to the silicon surface.

2. A method as defined in claim 1, wherein said step of applying comprises alloying or sintering said film or foil located on said silicon surface onto said silicon in a reducing atmosphere.

3. A method as defined in claim 2, wherein said step of applying further comprises pressing the film or foil on said silicon surface against said silicon surface during said sintering or alloying process under mechanical pressure.

4. A method as defined in claim 1, wherein films or foils selected from the groups consisting of aluminium, aluminium/silicon alloys, iron/silicon alloys, tin, lead, copper and antimony, arsenic, zinc or alloys of these metals with each other are used as contact material.

5. A method as defined in claim 1, wherein said step of applying comprises sintering or fusing said film or foil on said silicon by brief heating with the aid of a focussed light or laser beam.

6. A method as defined in claim 1, wherein the stamped film or foil is retained, transported or processed together with its associated stamped carrier adhering to a conveyor belt.

7. A method as defined in claim 6, wherein an organic plastic is used as a material for said carriers and said conveyor belt.

* * * * *